(12) United States Patent
Tay (10) Patent No.: US 6,744,032 B1
(45) Date of Patent: Jun. 1, 2004

(54) ARRANGEMENT OF MICROLENSES IN A SOLID-STATE IMAGE SENSOR FOR IMPROVING SIGNAL TO NOISE RATIO

(75) Inventor: Hiok-Nam Tay, Irvine, CA (US)

(73) Assignee: ESS Technology, Inc., Newport Beach, CA (US)

( * ) Notice: Subject to any disclaimer, the term of this patent is extended or adjusted under 35 U.S.C. 154(b) by 182 days.

(21) Appl. No.: 09/982,540

(22) Filed: Oct. 17, 2001

(Under 37 CFR 1.47)

(51) Int. Cl.[7] .............................................. H01L 27/00
(52) U.S. Cl. ...................... 250/208.1; 257/432; 438/65
(58) Field of Search .............................. 250/208.1, 216, 250/214.1, 226; 257/294, 432, 433, 434, 436; 438/64, 65, 66

(56) References Cited

U.S. PATENT DOCUMENTS 5,250,798 A * 10/1993 Iizuka et al. ............. 250/208.1
5,610,390 A * 3/1997 Miyano ...................... 250/216
5,677,200 A * 10/1997 Park et al. ..................... 438/70

* cited by examiner

Primary Examiner—Kevin Pyo
(74) Attorney, Agent, or Firm—Farjami & Farjami LLP (57) ABSTRACT

A radiation receiving apparatus that comprises a pixel array and one or more microlenses located between the source of radiation and a less sensitive pixel in the pixel array. The arrangement of microlenses in a radiation receiving apparatus utilize a system architecture that recognizes that within a pixel array, there is typically a less sensitive pixel (i.e. one receiving light in the blue spectrum) and a more sensitive pixel (i.e. one receiving light in the red spectrum). A microlens is placed in physical proximity to the less sensitive pixel in order to decrease the inherent difference in sensitivity between the less sensitive pixel and the more sensitive pixel, in turn increasing the intensity of radiation incident upon the detecting area of the less sensitive pixel. The detecting area may include a photogate or a photodiode for sensing radiation.

21 Claims, 6 Drawing Sheets

ARRANGEMENT OF MICROLENSES IN A SOLID-STATE IMAGE SENSOR FOR IMPROVING SIGNAL TO NOISE RATIO

BACKGROUND OF THE INVENTION

1. Technical Field

This invention relates to solid-state image sensors. In particular, the invention relates to an improved system for arranging microlenses in the radiation receiving apparatus for use with a solid-state image sensor so as to improve the signal to noise ratio of the solid-state image sensor.

2. Background

Solid-state image sensors have broad applications in many areas including commercial, consumer, industrial, medical, defense and scientific fields. Solid-state image sensors convert a received image from an object to a signal indicative of the received image. Solid-state image sensors are fabricated from semiconductor materials (such as silicon or gallium arsenide) and include imaging arrays of light detecting (i.e., photosensitive) elements (also known as photodetectors) interconnected to generate analog signals representative of an image illuminating the device. Examples of solid-state image sensors including charge coupled devices (CCD), photodiode arrays, charge injection devices (CID), hybrid focal plane arrays and complementary metal oxide semiconductor (CMOS) imaging devices.

Solid-state image sensors are fabricated from semiconductor materials (such as silicon or gallium arsenide) and include imaging arrays of light detecting (i.e., photosensitive) elements (also known as photodetectors) interconnected to generate analog signals representative of an image illuminating the device. These imaging arrays are typically formed from rows and columns of photodetectors (such as photodiodes, photoconductors, photocapacitors or photogates), each of which generate photo-charges. The photo-charges are the result of photons striking the surface of the semiconductor material of the photodetector, which generate free charge carriers (electron-hole pairs) in an amount linearly proportional to the incident photon radiation.

Each photodetector in the imaging array receives a portion of the light reflected from the object received at the solid-state image sensor. Each portion is called a picture element or "pixel." Each individual pixel provides an output signal corresponding to the radiation intensity falling upon its detecting area (also known as the photosensitive or detector area) defined by the physical dimensions of the photodetector. The photo-charges from each pixel are converted to a signal (charge signal) or an electrical potential representative of the energy level reflected from a respective portion of the object The resulting signal or potential is read and processed by video processing circuitry to create an electrical representation of the image.

The detecting area of each pixel is typically smaller than the actual physical pixel dimensions because of manufacturing process constraints, the presence of other circuitry in the pixel area (such as the active elements in CMOS imager arrays) in addition to the photodetector and the proximity of adjacent pixels. The percentage ratio of the detector area to the pixel area is typically referred to as the optical "fill factor."

Typically, microlenses (also known as microlenticular arrays or lenslet arrays) increase the effective optical fill factor of a pixel by increasing (i.e., focusing) the amount of radiation that is incident upon the detecting area. The microlens covers an area larger than the detecting area so that the radiation that would normally fall outside the detecting area, is refracted by the microlens to the detecting area of the pixel. Microlenses are typically placed over every pixel in the pixel array to increase the radiation intensity (i.e., increasing the fill factor) that is incident on every pixel.

A problem with this approach is that microlenses placed over every pixel in the pixel array typically required a gap of 0.8 $\mu$m between each microlens due to conventional manufacturing requirements. Consequently, for pixels on the order of 3.5×3.5 $\mu$m, the microlenses has an approximate maximum diameter of 2.7 $\mu$m. As a result, a microlens situated above each pixel is only capable of covering about 47% of the pixel area.

An additional problem is that the noise in pixels of different colors is typically similar while; in contrast, the strength of the signals corresponding to the intensity of the incident light on these pixels differs. As an example in a CMOS image sensor, a characteristic of the semiconductor substrate is that the substrate is more sensitive to longer wavelengths of radiation as opposed to the shorter wavelengths. Blue light has a wavelength of 450 $\mu$m; green light has a wavelength of 550 $\mu$m; and red light has a wavelength of 650 $\mu$m. As a result, the pixel is typically 2 to 3 times less sensitive to a given intensity of blue light incident upon the detecting area than it is to the same intensity of incident red light. Thus, in order to provide signals of similar strength, a 2 to 3 times effective gain is presently applied to the blue signal during the post-processing step.

Unfortunately, as a result of having a weaker signal, the signal-to-noise (SNR or S/N) ratio for the blue pixels is lower than for the other pixels. As a result, when a gain is applied to the signal developed by the blue pixel in post-processing, the associated noise of the signal is increased as well. Consequently, the noise from the blue pixel tends to dominate the entire image created by the different signals from the entire pixel array. Thus, the SNR of the entire image (including signals corresponding to red light, green light, and blue light) is limited by the SNR of the blue pixel.

A further problem with this approach is the presence of cross-talk between neighboring pixels because radiation that falls outside the detecting area of the pixels may create electron-hole pairs in the substrate (i.e., generally the semiconductor area outside the photodetector area). The cross-talk is generated when electron-hole pairs, created by light incident upon the semiconductor surface outside the detecting area of a pixel, diffuse into the detecting area of a nearby pixel. These electron-hole pairs typically increase the detected light intensity in the detecting area of a nearby pixel.

Cross-talk significantly effects the signal produced by the blue pixel because of both the weak response of the blue pixel to blue light and the stronger response of the pixels to red and green light. The cross-talk signal in a blue pixel may be close to, if not greater than, the magnitude of the detected signal for blue light. Conventional designs have attempted to solve this problem by using a set of pre-calibrated cross-talk coefficients to subtract the signal due to cross-talk. Unfortunately, a certain amount of color error is caused by part-to-part variations that cannot be corrected.

Accordingly, there is a need to increase the pixel area that may be covered by a microlens and there is a further need to narrow the differential in signal response between different color pixels. There is also additional need to limit the amount of cross-talk between pixels in order to decrease unwanted color error.

SUMMARY

A number of technical advances are achieved in the art, by implementation of an arrangement of microlenses in a radiation receiving apparatus of a solid-state image sensor for improving signal to noise ratio. The invention may be broadly conceptualized as a radiation receiving apparatus that comprises a pixel array and one or more microlenses located between the source of radiation and a less sensitive pixel in the pixel array.

For example, this novel arrangement of microlenses in a radiation receiving apparatus may utilize a system architecture that recognizes that within a pixel array, there is typically a less sensitive pixel (i.e. one receiving light in the blue spectrum) and a more sensitive pixel (i.e. one receiving light in the red spectrum). A microlens is placed in physical proximity to the less sensitive pixel in order to decrease the inherent difference in sensitivity between the less sensitive pixel and the more sensitive pixel, in turn increasing the intensity of radiation incident upon the detecting area of the less sensitive pixel. The detecting area may include a photogate or a photodiode for sensing radiation.

In an implementation of this invention, the size of the face area of the microlens in relation to a detecting area in the less sensitive pixel is determined by this inherent difference in sensitivity. The less sensitive pixel converts a given intensity of a first portion of the radiation spectrum into a first signal level. Similarly, the more sensitive pixel will convert a similar intensity of a second portion of the radiation spectrum into a second signal level. Ideally, the ratio of the microlens face area to the detecting area of its associated less sensitive pixel may be substantially similar to a ratio of the second signal level to the first signal level.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

Reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

DETAILED DESCRIPTION

The invention is a microlens arrangement for use in association with the radiation receiving apparatus that may be utilized in association with various types of solid state image sensors, including but not limited to complementary metal oxide semiconductor (CMOS) imaging devices, charge couples devices (CCD), charge injection devices (CID), and metal oxide semiconductor (MOS) devices. As an example, the implementations of the invention are discussed in association with CMOS image sensors.

Figure 1:
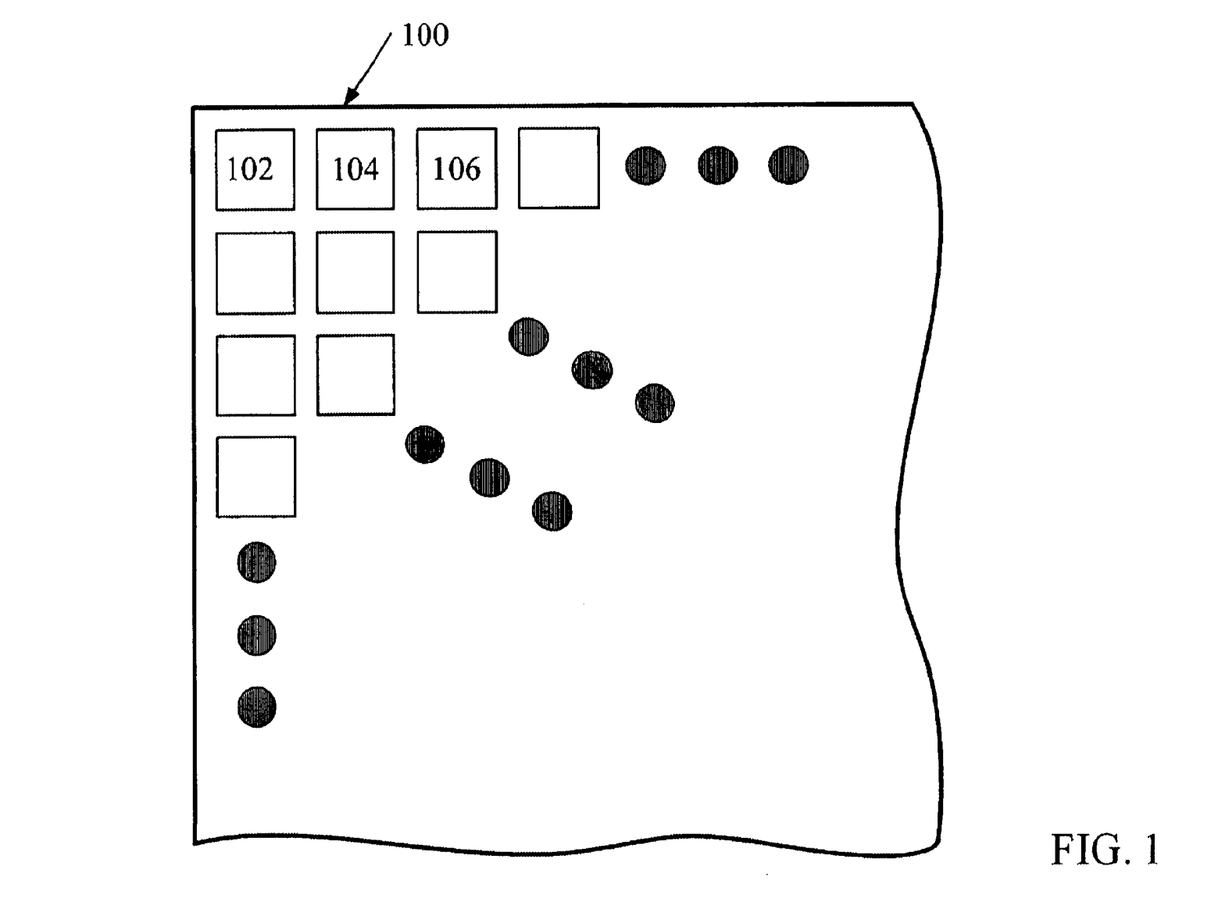
FIG. 1 is a top plan view of a radiation receiving apparatus for use in a solid-state image sensor with a plurality of pixels arranged in a pixel array.

FIG. 1 shows many individual pixels arranged in an array 100 in order to detect radiation falling incident over a given area. Although each pixel in the array in FIG. 1 is shown as being square-shaped, each individual pixel may be fabricated with different shapes such as a circular, rectangular, oval, pentagonal, or hexagonal. As shown in the example of FIG. 1, the pixel array 100 includes, among a plurality of other pixels, a first pixel 102, a second pixel 104, and third pixel 106. Each of these first, second and third pixels may be used to receive a different portion of the radiation spectrum for use in a solid-state image sensor. The portions of the radiation spectrum detected by the image sensor may include visible light range, range, ultraviolet range, microwave range, x-ray range, and gamma radiation range. So, where the solid-state image sensor is designed to receive visible light, the first pixel 102 may be optimized to detect red light, the second pixel 104 may be optimized to detect green light, and the third pixel 106 may be optimized to detect blue light. As used herein, the terms red, green and blue light refer to radiation falling within the various spectra of light as understood in the art.

Figure 2:
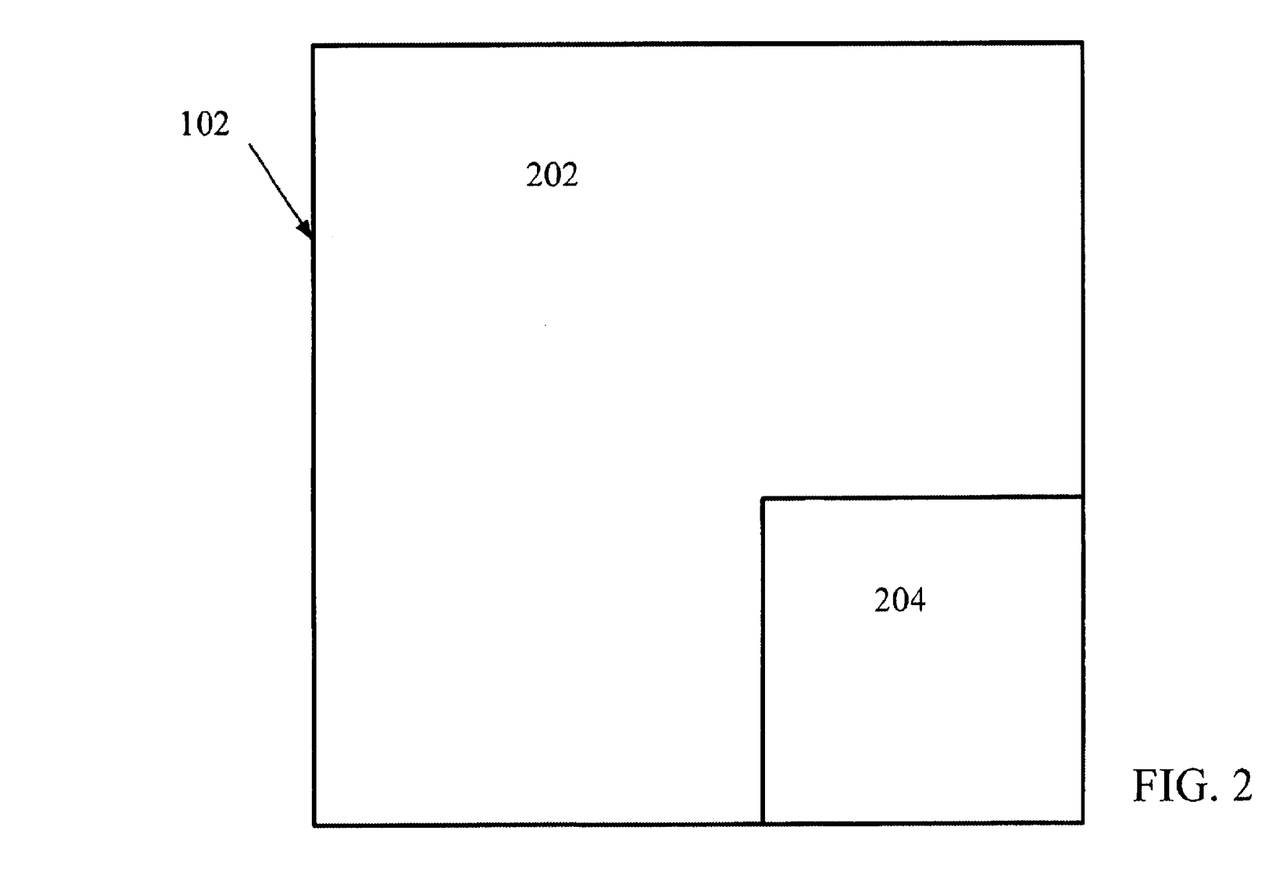
FIG. 2 is a block diagram of an individual pixels shown in FIG. 1.

As shown in FIG. 2, the first pixel 102 includes a detecting area 202 and a non-detecting area 204. The detecting area 202 is a photosensitive area on a solid-state (i.e., semiconductor) substrate, which may include a photodetector such as a photodiode, a photoconductor, a photocapacitor, or a photogate, all of which are well known by those skilled in the art. Only radiation falling incident upon the detecting area 202 generates a charge or electrical potential (generically referred to as signals) dependent upon the wavelength of the incident radiation, the intensity of the incident radiation, the vertical diffusion achieved by the incident radiation and the device characteristics of the photodetectors. The resulting photo-charges are converted into an electrical signal representative of the intensity of the incident radiation. The electrical signal generated by the various pixels are read and processed by video processing circuitry (not shown) to resulting in an electrical representation of an image.

The non-detecting area 204 typically includes circuitry that converts the charge generated by the detecting area 202 into a measurable signal and that transfers that signal to video processing circuitry (not shown) that ay be in the non-detecting area 204 and/or off the pixel array 100. As such, the non-detecting area 204 is not photosensitive thus the radiation falling on the non-detecting area 204 is typically not detected. It should be appreciated by those skilled in the art that the relative sizes and configurations of the detecting area 202 and the non-detecting area 204 may be altered in various solid-state image sensor designs without altering the invention.

Figure 3:
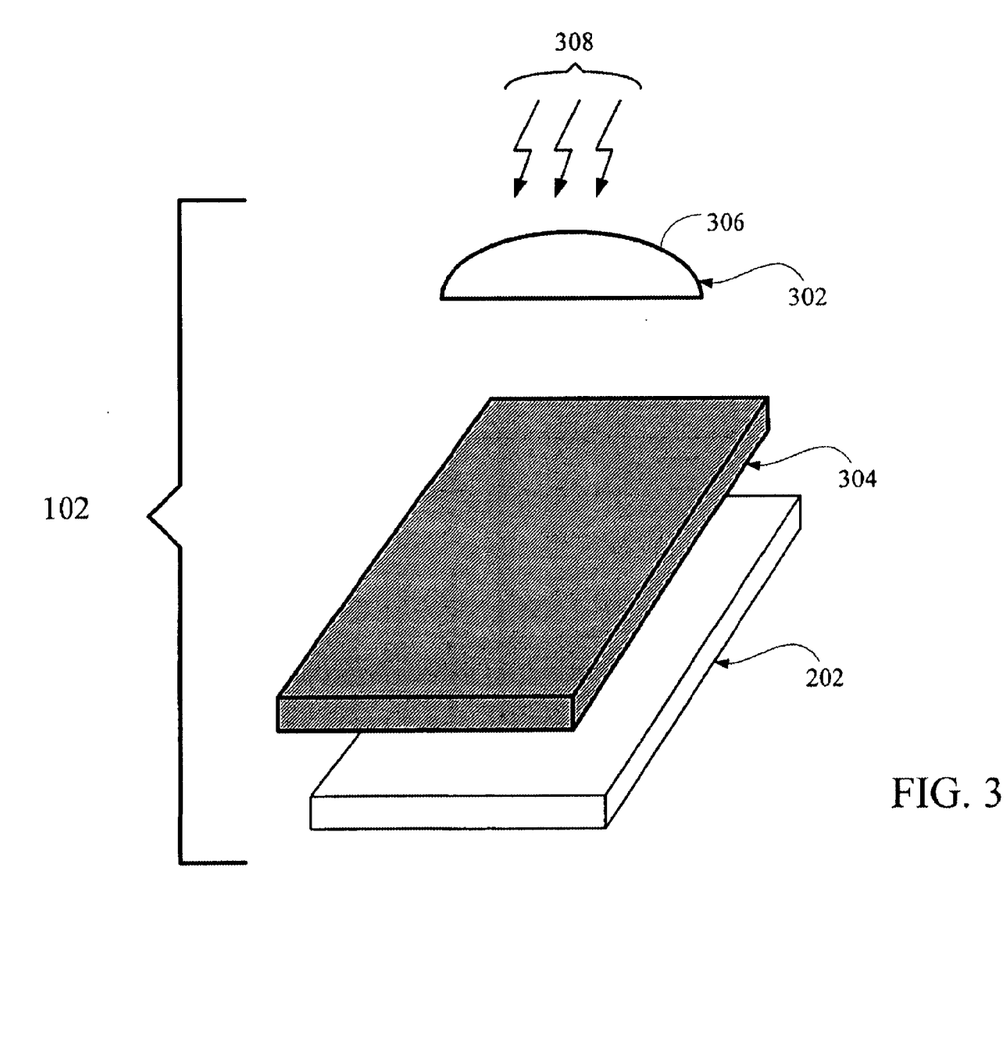
FIG. 3 is a perspective view of the pixel shown in FIG. 2 in association with a microlens and a filter.

FIG. 3 offers an exploded elevational perspective view of the first pixel 102. In this view it can be be seen that first pixel 102 has a microlens 302 and a filter 304 disposed between the between a source of radiation of 308 and the detecting area 202 of the first pixel. In a preferred approach the microlens and filter are disposed in physical proximity to the first pixel. In particular, in an example implementation, the microlens 302 is placed over the substrate to increase the amount of radiation falling incident upon the detecting area 202 of the fist pixel 102. In this manner, much of the radiation that is incident upon the microlens 302 can be refracted onto the detecting area of the associated substrate. Preferably, the microlens 302 is a hemishperical lens with a circular face area 306.

It is appreciated by those skilled in the art that the location of the microlens in relation to the filter and substrate, as well as the shape of the microlens, may be altered so long as a functionally significant portion of the radiation which is incident upon the microlens is refracted to detecting area of the pixel (or the photoreceptor). Various types of microlenses which may be used in conjunction with the present invention are well known in the art.

The filter 304 is typically also placed directly over the photoreceptor in order to allow only a specific portion of the radiation spectrum to pass through the filter 304 to the photoreceptor of the pixel. As shown in FIG. 3, the filter 304 may be placed below the microlens 302 such that radiation is first refracted by the microlens 302 and then filtered. Alternatively, the filter 304 may be placed above the microlens 302 (not shown in this configuration) such that radiation is first filtered and then refracted to the detecting area of the first pixel 102. In each case, the filter 304 is chosen to pass through the portion of the radiation spectrum associated with first pixel 102 while substantially obstructing other portions of the radiation spectrum. For example, if the pixel 102 is intended to detect the intensity of blue light, a blue filter is chosen to allow blue light to pass through. As a result, the detecting area of the first pixel 102 will detect the intensity of blue light. Similarly, the filter 304 can be utilized to filter other colors of light. A red filter may be used to allow red light to pass through and a green filter may be used to allow green light to pass through. Alternatively, the filter 304 may be used to pass a portion of the radiation spectrum outside the visible light spectrum. The construction and design of the filter 304 for use in association with the disclosed system is well known in the art.

Figure 4:
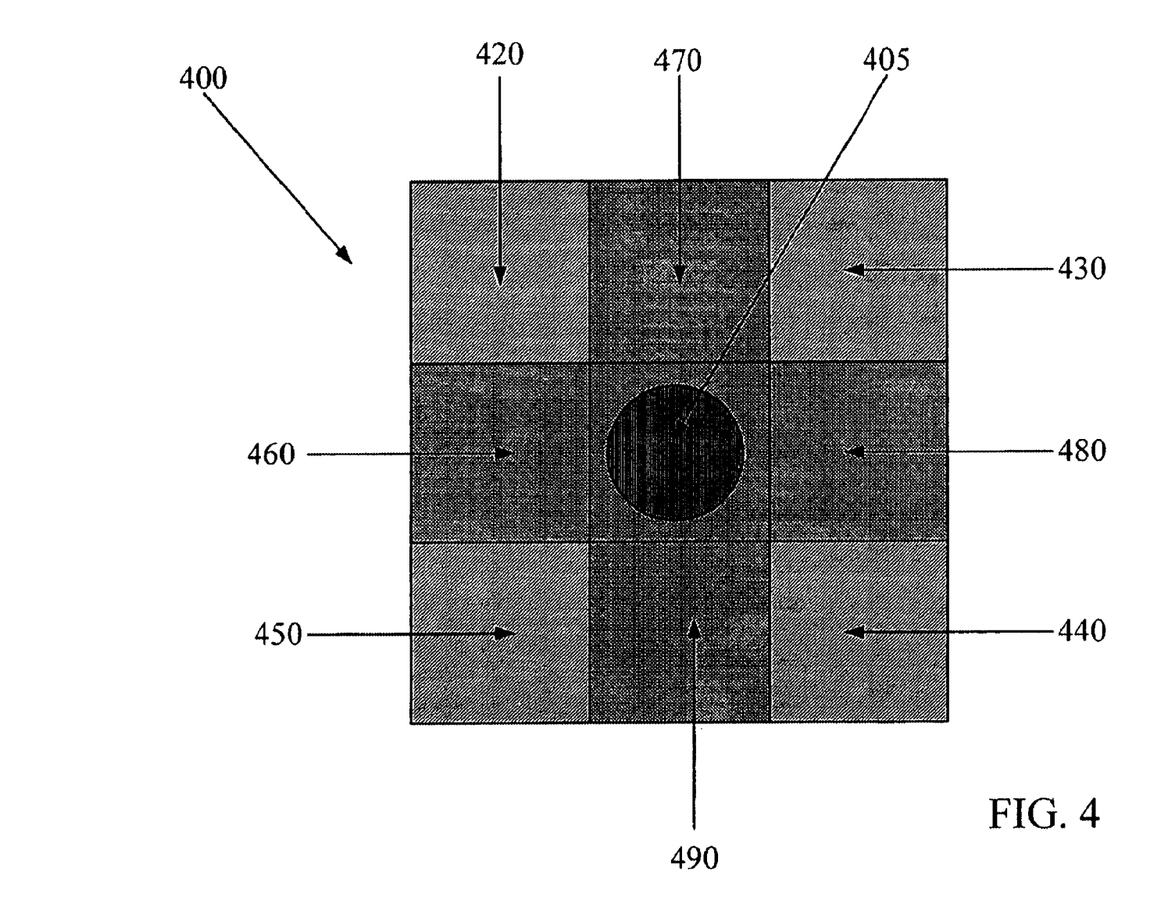
FIG. 4 is a top plan view of an example implementation of a microlens arrangement on the solid-state image sensor shown in FIG. 1.

FIG. 4 shows one example implementation of a portion of a pixel array 400 including an associated microlens arrangement. Each pixel in the pixel array 400 detects the intensity of a particular color of visible light. The pixel array 400 in this example includes red pixels 420, 430, 440, and 450, green pixels 460, 470, 480, and 490, and a blue pixel 410. The red pixels 420, 430, 440, and 450 are pixels associated with a red filter, the green pixels 460, 470, 580, and 490 are pixels associated with a green filter, and the blue pixel 410 is a pixel associated with a blue filter. The intensity of each component of light incident upon the respective pixels is converted into a measurable signal indicative of the intensity of the corresponding incident light.

Although the implementation of pixel array 400 in the example of FIG. 4 has red, green and blue pixels, the pixel array may include pixels associated with different color pixels. The pixel array may also be comprised of only two different color pixels. The shapes of the pixels may differ and the arrangement of the pixels within the pixel array 400 can be altered. Furthermore, the ratio of the number of pixels of one color to the number of pixels of another color can also be changed. Further, although the example implementation of the pixel array 400 shown in FIG. 4 is defined as a three by three pixel array including only one blue pixel, the number of pixels within a particular pixel array may be increased or decreased and the pixel array may also include more than one blue pixel.

Typically, an inherent difference in sensitivity exists between different color pixels (i.e. blue versus red pixels) within each array. In the example implementation shown in FIG. 4, a given intensity of blue light incident upon the blue pixel 410 results in the generation of a first electrical signal. The same intensity of green light incident upon the green pixels 460, 470, 480, and/or 490 results in the generation of a second electrical signal that is stronger than the first electrical signal. The same intensity of red light incident upon the red pixels 420, 430, 440, or 450 further results in a third electrical signal that stronger than the second electrical signal. As such, the green pixel is less sensitive than the red pixel and the blue pixel is less sensitive than the green pixel.

In order to improve the signal to noise ratio ("SNR") of the solid state image sensor, a microlens 405 is positioned over a less sensitive pixel within the pixel array. In the example implementation shown in FIG. 4, the microlens 405 is preferably positioned over the blue pixel 410. By employing a microlens 405 on the blue pixel 410, the radiation intensity incident upon detecting area of blue pixel 410 is increased, which has the advantage of increasing the signal to noise ratio of the blue pixel. Preferably, no microlenses would be positioned over the green and red pixels in this example embodiment. As a result, the signal intensity resulting from the radiation incident upon blue pixel 410 is increased relative to the signal intensity from the red pixels 420, 430, 440, and 450 and green pixels 460, 470, 480, and 490. As the signal strength of the blue pixel is increased relative to the other pixels in the pixel array by operation of the microlens, the effective gain that must be applied to the signal from the blue pixel in post-processing is decreased. As a result, the amount of effective gain applied to the noise associated with the blue pixel is also decreased. Consequently, the SNR of the entire pixel array is improved.

Preferably, a microlens may be positioned over each and every less sensitive pixel in the pixel array. Hence, if the pixel array included multiple blue pixels, a microlens would preferably be positioned over each blue pixel in the pixel array. Therefore, once a particular color pixel is designated as the less sensitive pixel, each pixel associated with the same color in the pixel array is also a less sensitive pixel.

The size of the microlens face area is preferably chosen in relation to the inherent difference in sensitivity between the less sensitive pixel and the more sensitive pixel. The best SNR of the pixel array is obtained when the signal response from each of the different color pixels is the same. Ideally, the face area of each microlens would be chosen to increase the intensity of radiation incident upon each less sensitive pixel by a factor equal to the difference in sensitivity between that less sensitive pixel and a more sensitive pixel in the pixel array. Therefore, if the red pixel is three times as sensitive to a given intensity of red light as compared to the sensitivity of the blue pixel to the same intensity of blue light, the microlens would preferably be chosen, where possible, to triple the intensity of radiation incident upon the detecting area of the blue pixel. However, as the ideal is not always possible, in certain implementations a microlens may be chosen in order to increase the signal from the less sensitive pixel by a factor that is less than the ideal. For example, if the red pixel is four times as sensitive to a given intensity of red light as compared to the sensitivity of the blue pixel to the same intensity of blue light, the microlens may be chosen to double the intensity of radiation incident upon the blue pixel. A two times gain may then be applied to the blue signal in post-processing. Generally, the less gain that must be applied to the signal developed by the less sensitive pixel, the better the SNR of the entire pixel array.

The less sensitive pixel in a particular pixel array is not necessarily the least sensitive pixel. In pixel array 400, the microlens 405 may alternatively be placed on the green pixel(s), thus decreasing the inherent difference in sensitivity between the green pixel and the red pixel. Similarly, the more sensitive pixel in a particular pixel array is not necessarily the most sensitive pixel. In the example implementation in FIG. 4, the size of the microlens 405 may alternatively be chosen in relation to the inherent difference in sensitivity between the blue pixel and the green pixel.

Figure 5:
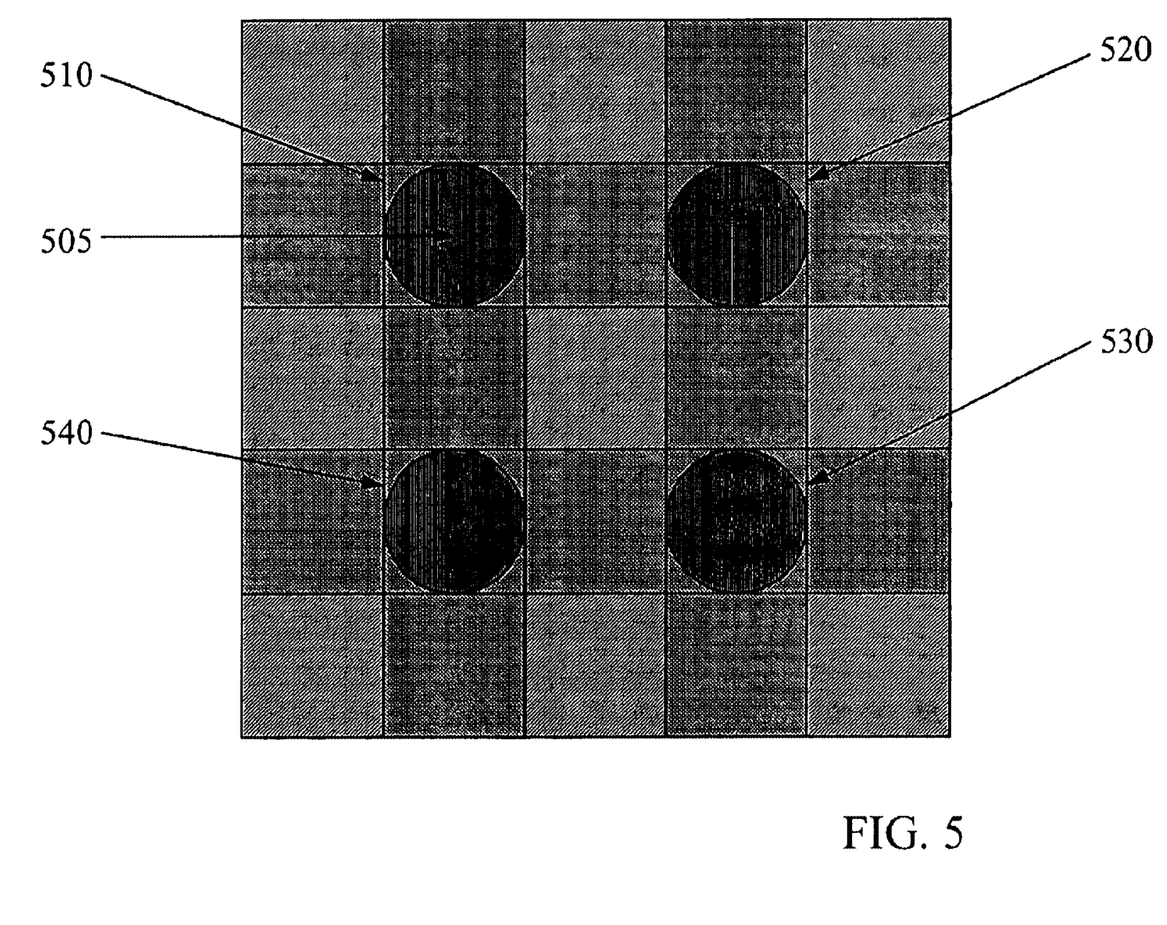
FIG. 5 is a top plan view of another example implementation of a microlens arrangement on the solid-state image sensor shown in FIG. 1.

In another example implementation shown in FIG. 5, the perimeter of the microlens may extend to the perimeter of its associated blue pixel, further increasing the intensity of radiation incident upon the blue pixel. In this example, the blue pixel is substantially physically separated from other blue pixels in the pixel array. The physical separation between blue pixels may be accomplished through the presence of one or more other pixels between blue pixels or through a spacing created by the absence of a pixel. In FIG. 5, the pixels associated with a particular color are preferably not adjacent to pixels associated with the same color. As such, the blue pixel 510 is typically not adjacent to another blue pixel (520, 530, or 540). Therefore, in this implementation, there would be no microlenses associated with the pixels adjacent to the blue pixel in each array, and as such, the size of the microlens(es) 505 associated with blue pixel(s) is not physically limited by the diameter of a microlens associated with adjacent pixels. As an example, the face area of microlens 505 may have a face area with a diameter about equal to the width of its associated blue pixel 510. As a result, the microlens face area covers about 78% of the surface area of the substrate of the blue pixel.

Although the microlenses 505 in FIG. 5 are shown as having circular face area, those microlenses may have faces of different shapes. In fact, it is altogether possible for each of the microlenses to have different shapes and even diameters. The only limitation on the microlenses is that they be sized such that each lens can fit on the substrate without any unnecessary gaps or overlaps. Hence, in this implementation, if the microlens face area is square, the width of the square microlens may be about equal to the width of its associated blue pixel.

Figure 6:
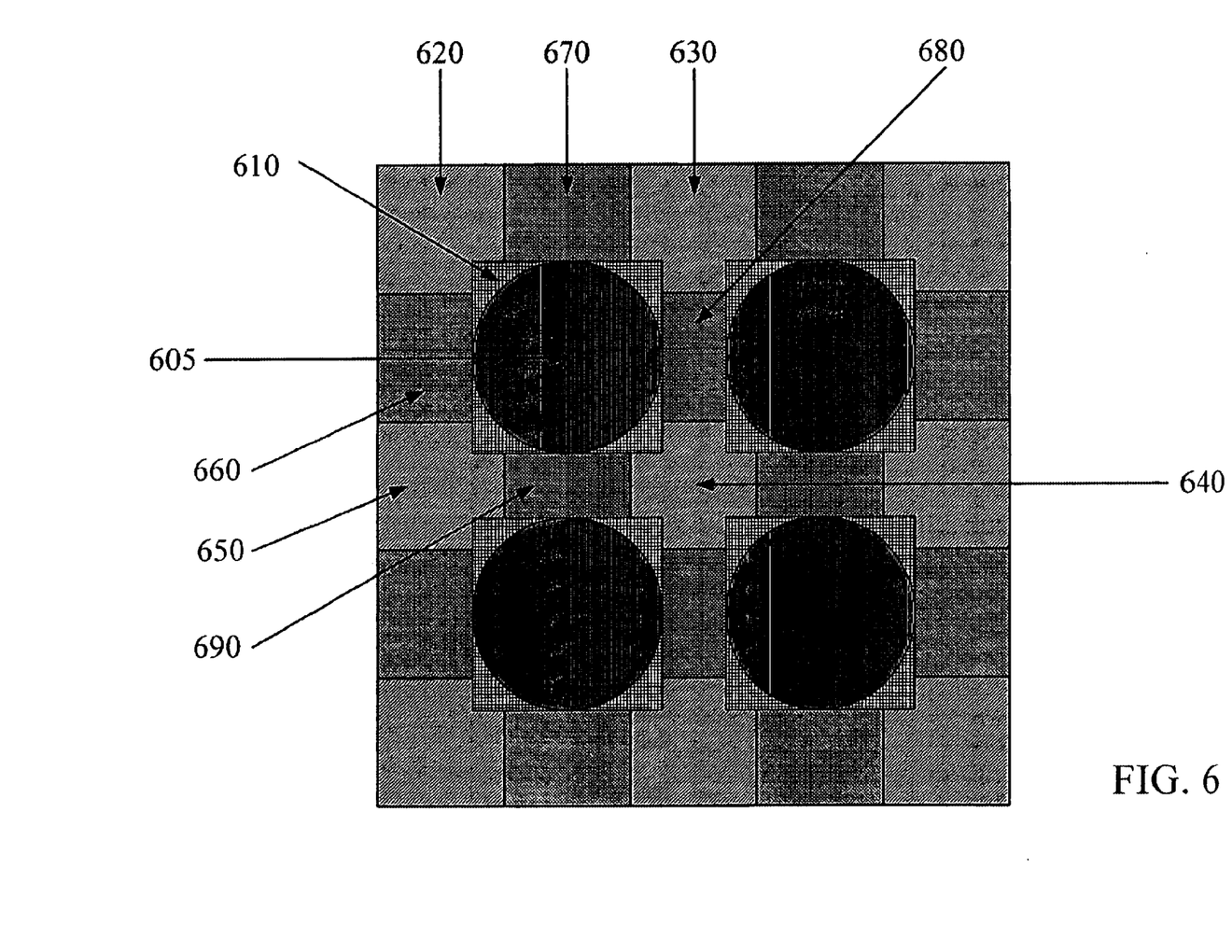
FIG. 6 is a top plan view of still another example implementation of a microlens arrangement on the solid-state image sensor shown in FIG. 1.

In another example implementation shown in FIG. 6, the microlens face area may extend past the meter of its associated less sensitive pixel, further increasing the radiation intensity incident upon the detecting area of the less sensitive pixel and as a result, further increasing the signal potentially generated by the less sensitive pixel. FIG. 6 shows an example in which the diameter of the face area of microlens 605 is greater than the width of its associated less sensitive pixel. Preferably, the diameter of the face is about equal to the diagonal of the less sensitive pixel so that the face area of the microlens 605 covers most of the less sensitive pixel area (including its non-detecting area). This allows for most of the radiation that falls upon the less sensitive pixel area to be refracted to the detecting area of its associated less sensitive pixel. Since the diameter of the face area of the microlens 605 in this implementation is larger than the width of its associated less sensitive pixel, a part of the face area of microlens 605 impinges upon the area of adjacent pixels (660, 670, 680, 690). Thus, radiation which would normally fall outside of the area of less sensitive pixel may also be refracted to its detecting area 202, further increasing the amount of radiation incident upon that detecting area. The size of the microlens face area may also be further increased such that the microlens also impinges upon additional pixels 620, 630, 640, and 650.

As in the other implementations, the microlens in the example of FIG. 6 may also be formed in different shapes. So, for instance, if a microlens with a square face area is used in association with a square-shaped less sensitive pixel, the microlens may cover the entire area of the less sensitive pixel without impinging on the area of adjacent pixel. However, the face area of the square microlens may also be increased such that the square microlens impinges on adjacent pixels in order to further increase the intensity of the radiation incident upon the detecting area of its associated less sensitive pixel.

As also shown in FIG. 6, a filter 610 with a surface area larger than the surface area of its associated less sensitive pixel may be positioned over the less sensitive pixel. The filter 610 also impinges upon the area of neighboring pixels (620, 630, 640, 650, 660, 670, 680, 690). The size of the filter 610 may be determined by the size of its associated microlens 605. Preferably, the surface area of the filter 610 is at least as big as the face area of the microlens 605 such that the radiation that is refracted by the microlens 605 also passes through the filter 610. In the example of FIG. 6, the filter 610 is square with a width substantially equal to the diameter of the face area of microlens 605. This implementation allows for radiation incident upon the part of the microlens 605 that is outside the area of the less sensitive pixel to also be refracted to the detecting area of the less sensitive pixel and further allows the refracted light to be filtered so that the desired component of the radiation is refracted to the detecting area. Further, filter 610 prevents red and green light from falling incident upon the pixel surface of any neighboring pixels which are underneath the edges of the filter. This has the collateral benefit of increasing the distance from the detecting area of each blue pixel to the nearest area where red or green light falls on neighboring pixels. As a result of this oversized filter approach, the amount of cross-talk in the less sensitive pixel is decreased.

The size of the microlenses and the filters is mainly limited by the distance to the detecting area of any neighboring pixels. Therefore, the microlens and filter may extend up to but not over the detecting area of any neighboring pixels. Although the filter is depicted in the figures as being square, it too may also be circular, elliptical, rectangular, or any other shape.

Although the present invention has been described as a microlens positioned only over the less sensitive (or blue) pixel, different image sensor constructions may have other pixels with lesser sensitivities to radiation. For example, certain image sensor construction may result in an image sensor that is more sensitive to shorter wavelengths of radiation. Thus, in the case of a pixel array as is described above containing blue, red, and green pixels, the red pixel may be the less sensitive pixel. In this case, the microlens (es) would then be associated with the red pixels (420, 430, 440, and 450).

While various embodiments of the invention have been described, it will be apparent to those of ordinary skill in the art that many more embodiments and implementations are possible that are within the scope of this invention.

What is claimed:

1. A radiation receiving apparatus for use in solid-state image sensor comprising:
   a less sensitive pixel for receiving a fist portion of a radiation spectrum;
   a more sensitive pixel for receiving a second portion of the radiation spectrum; and
   a microlens located between the less sensitive pixel and a source of radiation such that a substantial amount of the first portion of the radiation spectrum incident upon the microlens is refracted to the less sensitive pixel whereby an inherent difference in sensitivity between the less sensitive pixel and the more sensitive pixel is decreased.

2. The radiation receiving apparatus of claim 1 wherein each pixel includes a detecting area.

3. The radiation receiving apparatus of claim 2 wherein the microlens refracts radiation that would not otherwise have fallen on the detecting area onto the detecting area of the less sensitive pixel.

4. The radiation receiving apparatus of claim 1 wherein the less sensitive pixel further includes a detecting area and the microlens has a face area wherein a ratio of the face area to the detecting area is determined by the inherent difference in sensitivity between the less sensitive pixel and the more sensitive pixel.

5. The radiation receiving apparatus of claim 4 wherein the less sensitive pixel converts a given intensity of the first portion of the radiation spectrum into a first signal level, the more sensitive pixel converts a similar given intensity of the second portion of the radiation spectrum into a second signal level and the ratio of the face area of the microlens to the detecting area is substantially similar to a ratio of the second electrical signal to the first electrical signal.

6. The radiation receiving apparatus of claim 5 wherein the less sensitive pixel detects blue light.

7. The radiation receiving a of claim 5 wherein the more sensitive pixel detects red light.

8. The radiation receiving apparatus of claim 1 wherein the less sensitive pixel has a perimeter and the microlens has a perimeter that extends substantially to the perimeter of the less sensitive pixel.

9. The radiation receiving apparatus of claim 1 wherein the less sensitive pixel has a surface area and the microlens has a ace area that covers substantially all of the surface area of the less sensitive pixel.

10. The radiation receiving apparatus of claim 1 wherein the the radiation spectrum is invisible light selected from the group essentially consisting of:
    X-ray radiation;
    Gamma radiation;
    Ultraviolet light;
    Microwave radiation; and
    Infrared light.

11. A radiation receiving apparatus for use in solid-state image sensor comprising:
    two or more less sensitive pixels for receiving a first portion of a radiation spectrum, each of the less sensitive pixels having a perimeter;
    a more sensitive pixel for receiving a second portion of the radiation spectrum; and
    at least one microlens located between at least one of the less sensitive pixels and a source of radiation such that a substantial amount of the first portion of the radiation spectrum incident upon the microlens is refracted to the at least one of the less sensitive pixels associated with the microlens whereby an inherent difference in sensitivity between the less sensitive pixel and the more sensitive pixel is decreased, wherein the less sensitive pixels are physically separated, the microlens having a perimeter that extends to the perimeter of its associated less sensitive pixel.

12. The radiation receiving apparatus of claim 11 wherein the at least one microlens has a face area in physical proximity to at least one of the less sensitive pixels, the face area having a microlens perimeter, the less sensitive pixel has a perimeter and the less sensitive pixel is physically separated from another less sensitive pixel such that the microlens perimeter extends to the perimeter of the less sensitive pixel.

13. A method for improving the signal to noise ratio of a radiation receiving apparatus, the method comprising:
    defining a pixel array having a plurality of pixels such that each pixel of the plurality of pixels converts a corresponding portion of the radiation spectrum to an electrical signal;
    locating a less sensitive pixel within the pixel array wherein the less sensitive pixel is less sensitive than another pixel of the pixel array; and
    deploying a microlens in physical proximity to the less sensitive pixel between its photoconductor and a radiation source.

14. The method of claim 13 wherein locating further includes the less sensitive pixel having a detecting area.

15. The method of claim 14 wherein deploying further includes the microlens having a face area in physical proximity to the less sensitive pixel, the face area having a perimeter, the method further comprising:
    calculating an inherent difference in sensitivity between the less sensitive pixel and a more sensitive pixel; and
    determining a ratio of the face area to the detecting area in relation to the inherent difference in sensitivity.

16. The method of claim 15 further comprising selecting the perimeter of the microlens in relation to the ratio.

17. The method of claim 14 further comprising:
    determining a less sensitive signal level wherein the less sensitive pixel converts a given intensity of a first portion of he radiation spectrum into the less sensitive signal level;
    determining a more sensitive signal level, wherein the more sensitive pixel converts another given intensity of the second portion of the radiation spectrum into the more sensitive second signal level; and
    determining a ratio of the face area to the detecting area, wherein the ratio is substantially similar to a ratio of the more sensitive signal level to the less sensitive signal level.

18. The method of claim 17 further comprising selecting the perimeter of the microlens in relation to the ratio.

19. The method of claim 13 wherein locating includes a less sensitive pixel having a perimeter, further including the step of separating physically the less sensitive pixel from another less sensitive pixel such that the microlens extends to the perimeter of the less sensitive pixel.

20. A radiation receiving apparatus for use in association with a solid-state image sensor comprising:
    a less sensitive pixel within the array of pixels for detecting a first portion of the radiation spectrum and converting the first portion of the radiation spectrum into a first electrical signal;

a more sensitive pixel within the array of pixels for detecting a second portion of the radiation spectrum and converting the second portion of the radiation spectrum into a second electrical signal; and means for increasing the intensity of radiation incident upon the less sensitive pixel.

21. The radiation receiving apparatus of claim 20 wherein the means for increasing the intensity of radiation further increases the intensity at a detecting areas of the less sensitive pixel.

* * * * *